United States Patent [19]

Sanders

[11] 4,380,737
[45] Apr. 19, 1983

[54] FAST AGC SLEW CIRCUIT

[75] Inventor: David E. Sanders, Kenneth City, Fla.

[73] Assignee: E-Systems, Inc., Dallas, Tex.

[21] Appl. No.: 206,073

[22] Filed: Nov. 12, 1980

[51] Int. Cl.³ ............................................. H03G 3/20
[52] U.S. Cl. .................................... 330/134; 330/138;
330/279
[58] Field of Search ............... 330/129, 134, 138, 280,
330/279; 455/246, 247, 250, 251

[56] References Cited

U.S. PATENT DOCUMENTS 3,879,672  4/1975  Milanes ........................... 330/129 X Primary Examiner—James B. Mullins
Attorney, Agent, or Firm—Robert V. Wilder; Albert M. Crowder, Jr.

[57] ABSTRACT

A fast slew rate automatic gain control circuit (10) includes a variable gain amplifier (14) which is responsive to a gain control signal and an amplitude detector (18) which produces an amplitude signal corresponding to the amplitude of the received signal transmitted through amplifier (14). The amplitude signal is provided to the input node of a loop filter (24) and to the inputs of threshold detectors (30, 32). Positive and negative slew threshold circuits (34, 38) provide threshold signals respectively for the threshold detector circuits (30, 32). When the amplitude signal is within the range of the threshold signals the loop filter produces the gain control as the function of the amplitude signal. When the amplitude signal is less than the positive slew threshold signal the threshold detector (32) produces a drive signal which is provided to the loop filter (24) and causes the generation of the gain control signal to have an accelerated positive slew rate which increases the gain. When the amplitude signal exceeds the negative slew threshold signal the threshold detector (30) produces a drive signal which is supplied to the loop filter (24). When the negative drive signal is supplied to the loop filter the gain control signal is generated with an accelerated negative slew rate which increases the gain. The slew rate of the gain control signal is thus a function of the amplitude of the received signal.

10 Claims, 2 Drawing Figures

FAST AGC SLEW CIRCUIT

TECHNICAL FIELD

The present invention pertains in general to automatic gain control circuits and in particular to such a circuit which has the slew rate dependent upon the amplitude of the regulated signal.

BACKGROUND ART

Heretofore in automatic gain control circuits a large amplitude change in the regulated signal has caused the AGC loop to go into saturation. When this occurs the gain of the loop drops thereby causing the loop recovery time to be increased. During the recovery time the received signal can be lost due to insufficient gain by the variable gain amplifier or can be distorted due to excessive gain by the variable gain amplifier.

Therefore, there exists a need for an AGC circuit which can adapt the slew rate to the amplitude of the incoming signal to prevent saturation of the loop filter and reduce the recovery time of the loop to a minimum.

DISCLOSURE OF INVENTION

An automatic gain control circuit is disclosed which includes a variable gain amplifier having a received signal input thereto wherein the gain of the amplifier is controlled in response to a gain control signal. An amplitude detector is connected to receive from the amplifier the received signal and the amplitude detector generates an amplitude signal which corresponds to the amplitude of the received signal input to the amplitude detector. At first threshold detector circuit is provided for generating a first drive signal when the amplitude of the amplitude signal excees a first threshold signal. A second threshold detector circuit is provided for generating a second drive signal when the amplitude of the amplitude signal is less than a second threshold signal. Further circuitry is provided for generating the gain control signal as a function of the amplitude signal when the amplitude signal is between the amplitudes of the threshold signals. The gain control signal is generated as a function of the first drive signal when the amplitude signal exceeds the amplitude of the first threshold signal. The gain control signal is generated as a function of the second drive signal when the amplitude signal is less than the amplitude of the second threshold signal. The first and second drive signals cause the gain control signal to have a greater slew rate than when the gain control signal is generated as a function of the amplitude signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION

Figure 1:
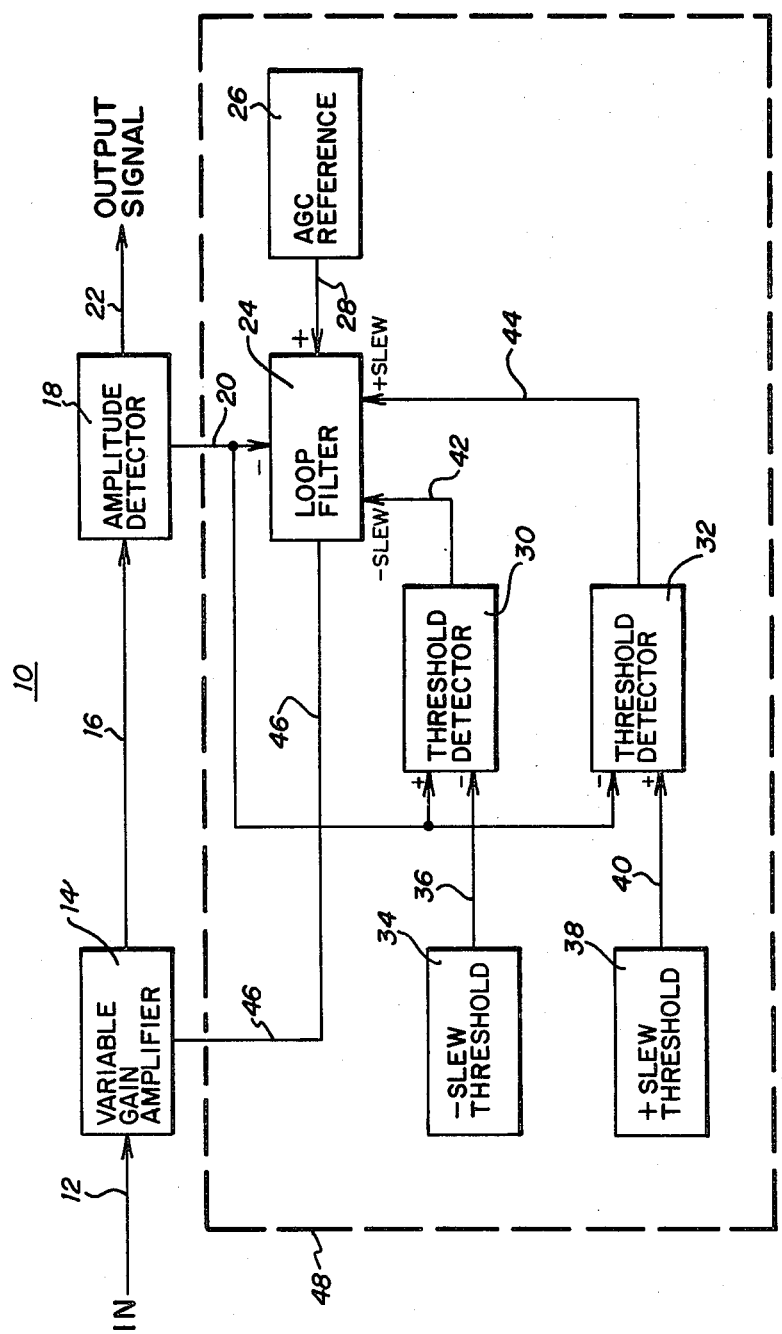
FIG. 1 is a block diagram of the automatic gain control circuit in accordance with the present invention.

In the following description material like reference numerals are used throughout the various views to represent like elements.

Referring now to FIG. 1 there is illustrated an automatic gain control circuit 10 with a fast slew circuit in accordance with the present invention. A received analog signal is conveyed through a line 12 to a variable gain amplifier 14. The received signal is transmitted from the variable gain control amplifier 14 through a line 16 to an amplitude detector 18. The amplitude detector 18 determines the amplitude of the received signal and produces an amplitude signal which is proportional to the amplitude of the received signal input to the amplitude detector. The amplitude signal is transmitted through a line 20 and the received signal is transmitted to an output line 22.

The amplitude signal is conveyed through line 20 to the negative input of a loop filter 24. An AGC reference circuit 26 produces a reference signal which is transmitted through a line 28 to the positive input terminal of loop filter 24.

The amplitude signal conveyed through line 20 is also supplied to the noninverting input of a threshold detector circuit 30 and the inverting input of a threshold detector circuit 32. A negative slew threshold circuit 34 supplies a first threshold signal through a line 36 to the inverting input of threshold detector 30. A positive slew threshold circuit 38 supplies a second threshold signal through a line 40 to the noninverting input of threshold detector 32. The output of threshold detector 30 is transmitted through a line 42 to the negative slew terminal of loop filter 24. The output of threshold detector 32 is transmitted through a line 44 to the positive slew terminal of loop filter 24.

The loop filter 24 generates a gain control signal which is transmitted through a line 46 to the variable gain amplifier 14 for controlling the gain thereof.

Figure 2:
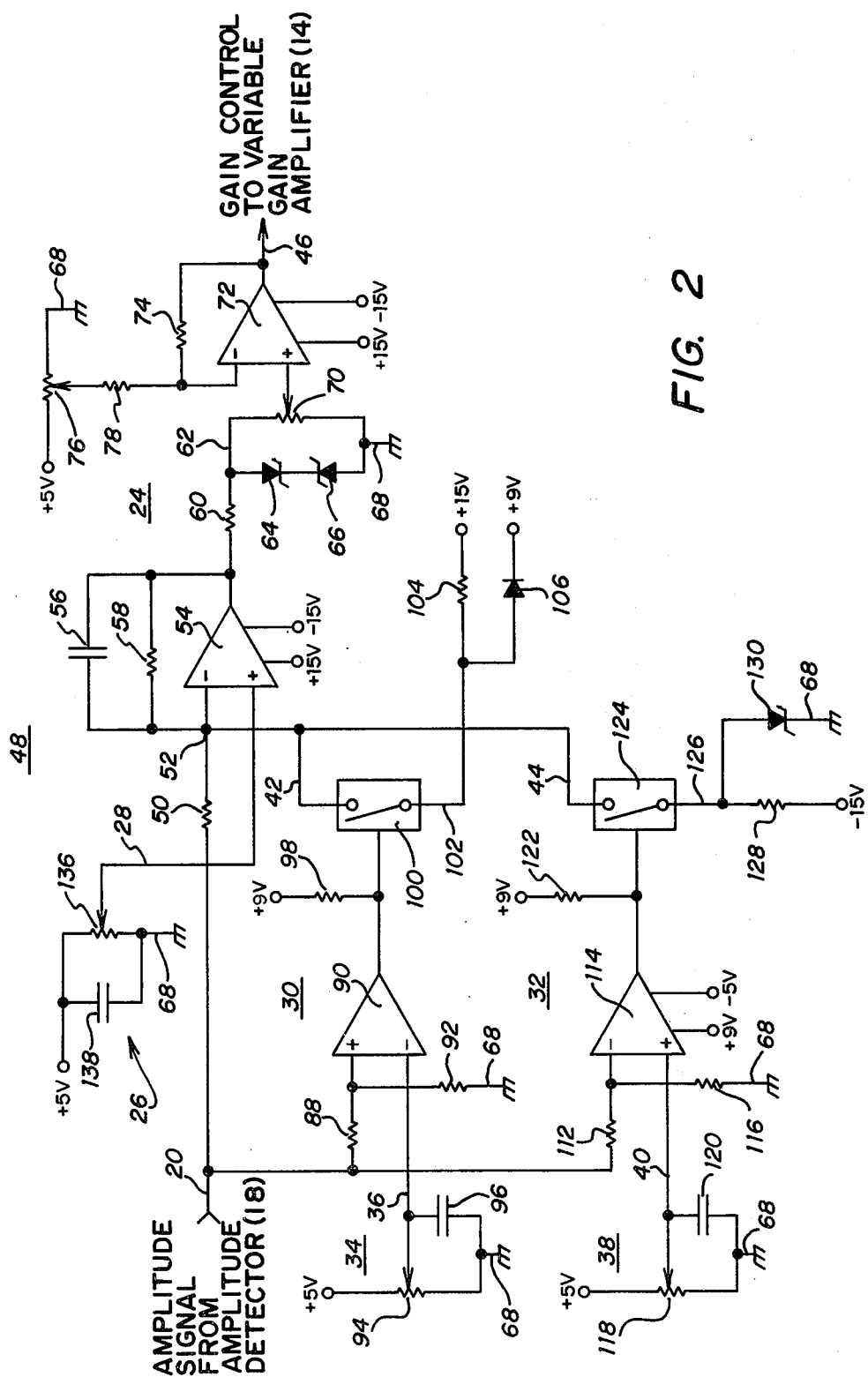
FIG. 2 is a detailed schematic illustration of the loop filter, threshold detectors and slew threshold circuits shown in FIG. 1.

The circuit elements included within the dotted line 48 are shown in greater detail in FIG. 2.

The operation of the automatic gain control circuit of the present invention is described briefly in reference to FIG. 1. The received signal on line 12 is transmitted through the variable gain amplifier 14 and the amplitude detector 18 to the output line 22. The purpose of the circuit of the present invention is to maintain the level of the received signal on line 22 within a limited range. The amplitude of the received signal is measured and the amplitude signal produced thereby is transmitted through line 20 to the loop filter 24, the threshold detector 30 and the threshold detector 32. When the level of the amplitude signal exceeds the level of the first threshold signal produced by the negative slew threshold circuit 34, the threshold detector 30 generates a first drive signal on line 42 and provides this drive signal to the loop filter 24. When the level of the amplitude signal is less than the level of the second threshold signal produced by positive slew threshold circuit 38, the threshold circuit 32 produces a second drive signal which is transmitted through line 44 to the positive slew terminal of loop filter 24. When the level of the amplitude signal is less than the level of the first threshold signal but greater than the level of the second threshold signal neither of the threshold detector circuits provides an input to the loop filter 24 and the only input is the amplitude signal itself which is transmitted through line 20 to the negative input of a loop filter 24.

When neither of the threshold detectors 30 or 32 is producing a drive signal the loop filter 24 compares the amplitude signal received over line 20 to the AGC reference signal received over line 28. The loop filter 24 drives the gain control signal transmitted through line 46 to such an amplitude as to cause the amplitude signal received from the amplitude detector 18 to correspond to the AGC reference signal received over line 28. This is carried out by changing the gain of the variable gain amplifier 14 to compensate for the changes in the signal level of the received signal provided through line 12.

When the amplitude signal exceeds either of the threshold signals a drive signal is provided to the loop filter which then generates the gain control signal as essentially a function of the drive signal produced by the threshold detectors. The drive signals cause the gain control signal to slew at a greater rate and therefore provide a faster response to changes in amplitude of the received signal. The drive signals transmitted through lines 42 and 44 have opposite polarities to cause the gain control signal to slew toward either an increasing gain or a decreasing gain dependent upon the amplitude of the received signal. When the amplitude signal returns to the range within the two threshold signals the outputs from the threshold detectors are terminated and the loop filter again generates the gain control signal as a function of the amplitude signal transmitted through line 20. Thus, the threshold detectors 30 and 32 control the operation of the automatic gain control circuit only when the amplitude signal exceeds one of the threshold signals.

A detailed embodiment of the circuit elements included within dotted line 48 is illustrated in FIG. 2. The amplitude signal on line 20 is transmitted through a resistor 50 to a node 52 which is connected to the inverting input of an operational amplifier 54. A feedback network comprising the parallel combination of a capacitor 56 and a resistor 58 are connected between the output of operational amplifier 54 and node 52.

The gain control signal produced at the output of operational amplifier 54 is conveyed through a resistor 60 to a node 62. Node 62 is the input to a level control circuit which includes first and second Zener diodes 64 and 66. The anode of Zener diode 64 is connected to node 62 while the cathode terminals of Zener diodes 64 and 66 are connected together. The anode of Zener diode 66 is connected to a common node 68.

The level control circuit further includes a potentiometer 70 which has the resistor terminals thereof connected between node 62 and node 68. The wiper terminal of potentiometer 70 is connected to the noninverting input of an operational amplifier 72. A feedback resistor 74 is connected between the output terminal of amplifier 72 and the inverting input terminal thereof.

An offset control circuit comprises a potentiometer 76 and a resistor 78. The resistor terminals of potentiometer 76 are connected between a +5 volts supply and the common node 68 and the wiper terminal of potentiometer 76 is connected to a first terminal of the resistor 78. A second terminal of resistor 78 is connected to the inverting input of operational amplifier 72. The gain control signal is transmitted from the output of operational amplifier 72 through line 46 to the variable gain control amplifier 14.

The amplitude signal on line 20 is transmitted through a resistor 88 to the inverting input of a comparator 90. A resistor 92 is connected between the inverting input of comparator 90 and the common node 68.

The negative slew threshold circuit 34 comprises a potentiometer 94 which has the resistor terminals connected between a positive 5 volt supply voltage and the common node 68. A capacitor 96 is connected between the common node 68 and the wiper terminal of potentiometer 94 which is further connected to the noninverting input of comparator 90.

The output terminal of comparator 90 is connected to a bias resistor 98 which is in turn connected to a +15 volt supply voltage. The output signal from operational amplifier 90 is connected to the control terminal of an FET switch 100. An input terminal 102 of switch 100 is connected to a resistor 104 which is in turn connected to the +15 volt supply. The terminal 102 is further connected to the anode terminal of a diode 106 which has the cathode terminal thereof connected to a positive 9 volt supply voltage. The output terminal of switch 100 is the line 42 which provides the first drive signal to the loop filter 24.

The amplitude signal transmitted through line 20 is further conveyed through a resistor 112 to the noninverting input of a comparator 114. A resistor 116 is connected between the noninverting input of the comparator 114 and a common node 68.

The positive slew threshold circuit 38 comprises a potentiometer 118 which has the resistive terminals thereof connected between the +5 volt supply voltage and the common node 68. A capacitor 120 is connected between the common node 68 and the wiper terminal of potentiometer 118 which is further connected through line 40 to the noninverting input of comparator 114. A resistor 122 is connected between the +9 volt supply voltage and the output of comparator 114. The output signal produced by comparator 114 drives the control terminal of an FET switch 124. The input terminal 126 of switch 124 is connected to the first terminal of a resistor 128 which has the remaining terminal thereof connected to a negative 15 volt supply voltage. Terminal 126 is further connected to the anode terminal of a Zener diode 130 which has the cathode terminal thereof connected to the common node 68. The second drive signal for the loop filter 24 is produced at the input terminal 126 and is transmitted to the line 44 when the switch 124 is closed by a switch control signal which is received from the comparator 114. The second drive signal is provided to the node 52 for controlling the generation of the gain control signal.

The automatic gain control circuit of the present invention regulates the amplitude of the received signal on line 22 so that it approximates the amplitude of the reference signal provided on line 28. The reference signal is generated at the wiper terminal of a potentiometer 136 which has the resistor terminals thereof connected between the +5 volt supply voltage and the common node 68. A capacitor 138 is connected in parallel with the resistor terminals of potentiometer 136.

The detailed operation of the automatic gain control circuit of the present invention is now given in reference to FIGS. 1 and 2. The loop filter 24 generates the gain control signal in response to the signals received at node 52. The gain control signal is a function of the differential between the AGC reference signal on line 28 and the signal at node 52. The output of operational amplifier 54 is transmitted through the feedback network comprising capacitor 56 and resistor 58 to the inverting input terminal thereof to ten to equilibrate the voltages on the inverting and noninverting inputs of the operational amplifier 54. The gain control signal is thus produced at the output of operational amplifier 54. The signal is transmitted to the immediately following circuit elements which provide limits on the maximum excursions of the gain control signal. The Zener diodes 64 and 66 set the maximum positive and negative voltages which can be reached at node 62. The potentiometer 70 is set to further limit the maximum excursions possible at node 70. The offset circuit comprising potentiometer 76 and resistor 78 determines the center point of the range of the gain control signal. Thus, the gain control signal on line 46 is limited in range by the Zener diodes 64 and 66 and the setting of the potentiometer 70 and this range is centered about the amplitude established by the adjustment of potentiometer 76.

The amplitude signal on line 20 is provided to the comparator 90 together with the first threshold signal which is derived from the negative slew threshold circuit 34. The comparator 90 produces a high output level when the amplitude signal is greater than the threshold signal on line 36 and produces a low level output signal when the amplitude signal on line 20 becomes less than the threshold signal on line 36. The high level output from comparator 90 closes the switch 100 to supply the drive signal on line 102 to node 52.

The amplitude signal on line 20 is supplied to the comparator 114 together with the threshold signal on line 40. The output of comparator 114 is driven to a high level when the amplitude signal on line 20 is less than the threshold signal on line 40. The output of the comparator 114 is driven to a low level when the amplitude signal on line 20 is greater than the threshold signal on line 40. A high output from comparator 114 closes the switch 124 and provides the drive signal at terminal 126 to node 52 of loop filter 24. It can be seen from the above that only one or none of the switches 100 and 124 are closed at any one time. When either of the switches 100 and 124 close the drive signal for the loop filter 24 is provided by the closed switch and when neither switch is closed the drive for the loop filter 24 is provided by the amplitude signal itself.

The drive signals from terminals 102 and 126 have opposite polarity and have a substantially greater magnitude than the amplitude signal transmitted through line 20. Thus when either of the drive signals are supplied to the loop filter 24 the slew rate of the gain control signal at line 46 is considerably greater than the slew rate when the input to the loop filter is only the amplitude signal. As a result of this operation the response time of the loop filter is considerably reduced when the level of the amplitude signal exceeds the range established by the threshold signals on lines 36 and 40.

In summary, the automatic gain control circuit of the present invention provides a fast slew rate when the amplitude of the received signal rises to a high amplitude or drops to a low amplitude. Increased drive for the loop filter is provided at these extreme amplitudes and the response time of the filter is substantially reduced.

I claim:

1. An automatic gain control circuit comprising:
   a variable gain amplifier having input thereto a received signal and having the gain thereof responsive to a gain control signal;
   an amplitude detector connected to receive from said amplifier the received signal transmitted therethrough, said amplitude detector generating an amplitude signal corresponding to the amplitude of the received signal input to said amplitude detector;
   means for generating a first drive signal when said amplitude signal exceeds a first threshold signal;
   means for generating a second drive signal when said amplitude signal is less than a second threshold signal; and
   means for generating a first gain control signal varying as a function of said amplitude signal when said amplitude signal is between the amplitudes of said threshold signals, generating a second gain control signal varying as a function of said first drive signal when said amplitude signal exceeds the amplitude of said first threshold signal and generating a third gain control signal varying as a function of said second drive signal when said amplitude signal is less than the amplitude of said second threshold signal.

2. The automatic gain control circuit recited in claim 1 wherein said means for generating a first drive signal comprises:
   a comparator having said amplitude signal as a first input and said first threshold signal as a second input; and
   a switch driven by said comparator, the switch receiving a voltage signal at an input terminal and supplying said first drive signal to said means for generating the gain control signal when said switch is activated by said comparator.

3. The automatic gain control circuit recited in claim 1 wherein said means for generating a second drive signal comprises:
   a comparator having said amplitude signal as a first input and said second threshold signal as a second input; and
   a switch driven by said comparator, the switch receiving a voltage signal at an input terminal and supplying said second drive signal to said means for generating the gain control signal when said switch is activated by said comparator.

4. The automatic gain control circuit recited in claim 1 wherein said means for generating comprises:
   a first operational amplifier connected to receive said amplitude signal at the inverting input thereof and a reference signal at the noninverting input;
   a feedback network connected between the output of said first operational amplifier and the inverting input thereof; and
   means for coupling the gain control signal, which is the output signal of said first operational amplifier, to said variable gain amplifier.

5. The automatic gain control circuit recited in claim 1 including means for limiting the extreme amplitudes of said gain control signal.

6. The automatic gain control circuit recited in claim 5 wherein said means for limiting comprises:
   an operational amplifier having an offset reference voltage applied to the inverting input terminal thereof;
   a first Zener diode having the anode terminal thereof connected to receive said gain control signal;
   a second Zener diode having the anode terminal thereof connected to a common node and the cathode terminal thereof connected to the cathode terminal of said first Zener diode;
   a potentiometer having two of the terminals thereof connected between the anode terminal of said first Zener diode and the anode terminal of said Zener diode and the wiper terminal of said potentiometer connected to the noninverting input of said operational amplifier; and a feedback resistor connected between the output of said operational amplifier and the inverting input terminal thereof.

7. An automatic gain control circuit comprising;

a variable gain amplifier having input thereto a received signal and having the gain thereof varying in accordance with a gain control signal;

an amplitude detector connected to receive from said amplifier the received signal transmitted therethrough, said amplitude detector generating an amplitude signal corresponding to the amplitude of the received signal input to the amplitude detector;

a first comparator having said amplitude signal as a first input and a first threshold signal as a second input and generating a first switch control signal when said amplitude signal exceeds said first threshold signal;

a second comparator having said amplitude signal as a first input and a second threshold signal as a second input and generating a second switch control signal when said amplitude signal is less than said second threshold signal;

a loop filter having an input terminal for receiving said amplitude signal, said loop filter generating said gain control signal;

a first switch for connecting a first drive signal to a second input terminal of said loop filter upon receipt of said first switch control signal; and a second switch for connecting a second drive signal to the third terminal of the loop filter upon receipt of the second switch control signal;

said loop filter generating a gain control signal varying as a function of the amplitude signal when the amplitude signal is between the amplitude of the threshold signals, and generating a gain control signal that varies as a function of the first drive signal when the amplitude signal exceeds the amplitude of the first threshold signal and generates a gain control signal that varies as a function of a second drive signal when the amplitude signal is less than the amplitude of the second threshold signal.

8. The automatic gain control circuit recited in claim 7 including a limit control circuit comprising:

an operational amplifier connected to receive an offset control signal at the inverting input terminal thereof;

a feedback resistor connected between the output terminal and inverting input terminal of said operational amplifier;

a serial combination of Zener diodes having the anode terminal of a first Zener diode connected to receive said gain control signal, the cathode terminal of said first Zener diode connected to the cathode terminal of a second Zener diode and having the anode terminal thereof connected to a common node; and a potentiometer having a first terminal connected to the anode terminal of said first Zener diode, a second terminal connected to said common node and a wiper terminal thereof connected to the noninverting input of said operational amplifier, said potentiometer setting the amplitude limits for said gain control signal which is transmitted through said operational amplifier to said gain control circuit.

9. The automatic gain control circuit recited in claim 7 wherein said first and second drive signals have opposite polarity.

10. A method for regulating the amplitude of a received signal, comprising the steps of:

passing said received signal through a variable gain amplifier, the gain of which is determined by a gain control signal;

detecting the amplitude of the output signal from said variable gain amplifier and generating an amplitude signal corresponding to the amplitude of said output signal;

generating a first drive signal when said amplitude signal exceeds the amplitude of a first threshold signal;

generating a second drive signal when said amplitude signal is less than the amplitude of a second threshold signal;

generating said gain control signal as a function of said amplitude signal when said amplitude signal is in the range between said thresholds;

generating said gain control signal as a function of said first drive signal when sad amplitude signal exceeds said first threshold signal; and generating said gain control signal as a function of said second drive signal when said amplitude signal is less than said second threshold signal.

* * * * *